United States Patent [19]
Gris

[11] Patent Number: 6,156,616
[45] Date of Patent: Dec. 5, 2000

[54] METHOD FOR FABRICATING AN NPN TRANSISTOR IN A BICMOS TECHNOLOGY

[75] Inventor: Yvon Gris, Tullins, France

[73] Assignee: SGS-Thomson Microelectronics S.A., Gentilly, France

[21] Appl. No.: 08/969,800

[22] Filed: Nov. 13, 1997

[30]    Foreign Application Priority Data

Nov. 19, 1996 [FR] France .................................. 96 14411

[51] Int. Cl.$^7$ .............................................. H01L 21/331
[52] U.S. Cl. ........................ 438/309; 438/317; 438/341; 438/348; 438/350
[58] Field of Search .................................. 438/309, 317, 438/341, 348, 350, 119

[56]            References Cited

U.S. PATENT DOCUMENTS

| | | | |
|---|---|---|---|
| 4,215,418 | 7/1980 | Muranatsu | 364/757 |
| 4,232,439 | 11/1980 | Shibata | 438/302 |
| 4,276,543 | 6/1981 | Miller et al. | 340/347 |
| 4,752,589 | 6/1988 | Schaber | 437/31 |
| 4,960,726 | 10/1990 | Lechaton et al. | 437/31 |
| 4,980,302 | 12/1990 | Shimizu | 437/31 |
| 5,008,207 | 4/1991 | Blouse et al. | 438/192 |
| 5,015,594 | 5/1991 | Chu et al. | 437/31 |
| 5,017,990 | 5/1991 | Chen et al. | 257/586 |
| 5,045,484 | 9/1991 | Yamada et al. | 437/31 |
| 5,100,815 | 3/1992 | Tsubone et al. | 437/34 |
| 5,137,840 | 8/1992 | Desilents et al. | 438/371 |
| 5,192,992 | 3/1993 | Kim et al. | 257/370 |
| 5,238,850 | 8/1993 | Matsunaga et al. | 437/40 |
| 5,321,650 | 6/1994 | Kikuchi et al. | 365/177 |
| 5,416,031 | 5/1995 | Miwa | 437/31 |
| 5,429,959 | 7/1995 | Smayling | 437/34 |
| 5,439,832 | 8/1995 | Nakamura | 438/192 |
| 5,471,085 | 11/1995 | Ishigaki et al. | 257/370 |
| 5,478,760 | 12/1995 | Yang | 437/31 |
| 5,488,003 | 1/1996 | Chambers et al. | 437/31 |
| 5,512,497 | 4/1996 | Ikeda et al. | 438/233 |
| 5,705,410 | 1/1998 | Guegan | 438/302 |
| 5,753,957 | 5/1998 | Watabe | 257/378 |
| 5,773,349 | 6/1998 | Ham | 438/348 |
| 5,880,000 | 4/1999 | Gris | 438/309 |
| 5,953,600 | 9/1999 | Gris | 438/200 |

FOREIGN PATENT DOCUMENTS 0 495 329  7/1992  European Pat. Off.  ........ H01L 21/82

OTHER PUBLICATIONS

French Search Report from French Patent Application 96 14411, filed Nov. 19, 1996.

French Search Report from French Patent Application 96 14412, filed Nov. 19, 1996.

*Primary Examiner*—Carl Whitehead, Jr.
*Assistant Examiner*—Maria Guerrero
*Attorney, Agent, or Firm*—Wolf, Greenfield & Sacks, P.C.; James H. Morris; Theodore E. Galanthay

[57]            ABSTRACT

The present invention relates to a bipolar transistor of NPN type implemented in an epitaxial layer within a window defined in a thick oxide layer, including an opening formed substantially at the center of the window, this opening penetrating into the epitaxial layer down to a depth of at least the order of magnitude of the thick oxide layer, an N-type doped region at the bottom of the opening, a first P-type doped region at the bottom of the opening, a second lightly-doped P-type region on the sides of the opening, and a third highly-doped P-type region in the vicinity of the upper part of the opening, the three P-type regions being contiguous and forming the base of the transistor.

10 Claims, 6 Drawing Sheets

METHOD FOR FABRICATING AN NPN TRANSISTOR IN A BICMOS TECHNOLOGY

BACKGROUND OF THE INVENTION

1. Field of the Invention

The present invention relates to the field of integrated circuits and more specifically to the fabrication of an NPN transistor.

2. Discussion of the Related Art

In a patent application filed on even day herewith under attorney docket number S1022/7945 and incorporated herein by reference, a method for fabricating a bipolar transistor compatible with a BICMOS technology (that is, a technology enabling the simultaneous fabrication of bipolar transistors and of complementary MOS transistors) is described.

An example of a NPN transistor obtained by using this technology is shown in FIG. 12A of this patent application, which is reproduced identically in appended FIG. 1.

This NPN transistor is formed in an epitaxial layer 2 which is above a buried layer 3 formed in a P-type silicon substrate (not shown). The transistor is formed in a window made in a thick oxide layer 5. References 21 and 22 designate thin silicon oxide and silicon nitride layers which are not necessary for the description of the bipolar transistor. Region 23 is a P-type doped polysilicon layer called the base polysilicon since the base contact diffusion 32 is formed from this silicon layer. Polysilicon layer 23 is coated with an encapsulation silicon oxide layer 24. A central emitter-base opening is formed in layers 22 and 23 altogether. A thin silicon oxide layer 31 covers the sides of polysilicon layer 23 and the bottom of the opening. In this opening, an N-type high energy implant 30 meant for the forming of a sub-collector region with a selected doping level is performed. The walls of the emitter-base opening are coated with a silicon nitride layer 44. Polysilicon lateral spacers 43 are formed on the sides of the opening. Before the forming of silicon nitride region 44 and of polysilicon spacers 43, an intrinsic base implant 33 is formed. After the spacers have been formed, a highly-doped N-type polysilicon layer 46 from which is formed emitter region 49 is deposited. Polysilicon layer 46 is coated with an encapsulation oxide layer 47. The general structure is coated with an insulating and planarizing layer 51 through which are formed emitter contact openings 55 joining polysilicon layer 46 and base contact openings 56 joining polysilicon layer 23. Further, a collector contact (not shown) is made via an N-type drive-in towards buried layer 3.

Referring to FIG. 1, the emitter-base opening penetrates slightly into the thickness of epitaxial layer 2. This inevitably results from the fabrication process and possible defects in the selectivity of the etching of polysilicon layer 23 with respect to the etching of the substrate silicon.

Actually, the depth of the penetration is not precisely controlled and can for example vary of ±20 nm around a provided value of 30 nm according to slight variations of the fabrication parameters. This results in variable characteristics for the NPN transistor, having a variable distance between the extrinsic base and the intrinsic base and thus having a fluctuating resistance of access to the base. Further, the bottom surface area of the opening—emitter surface area—results from an end of doped polysilicon etching and risks of being of poor quality, which is also prejudicial to the stability of the characteristics of the transistor.

SUMMARY OF THE INVENTION

An object of the present invention is to provide an NPN transistor of the same type as that of FIG. 1 but the parameters of which can be controlled accurately independently from the fluctuations of the fabrication parameters.

Another object of the present invention is to provide such a transistor wherein the stray capacitance between the extrinsic base and the collector is reduced.

Another object of the present invention is to provide such a transistor wherein the stray capacitances and the resistance of access to the base are adjustable.

To achieve the se and other objects, the present invention provides a transistor of NPN type implemented in an epitaxial layer within a window defined in a thick oxide layer, including an opening formed substantially at the center of the window, this opening penetrating into the epitaxial layer down to a depth of at least the order of magnitude of the thick oxide layer, the walls of the opening being coated with a layer of silicon oxide and with a layer of silicon nitride; a polysilicon spacer formed on the lateral walls and a portion of the bottom wall of the opening; an N-type highly-doped polysilicon layer formed in the opening and in contact with the epitaxied layer at the bottom of the opening within the space defined by the spacer; an N-type doped region at the bottom of the opening; a first P-type doped base region at the bottom of the opening; a second lightly-doped P-type region on the sides of the opening; and a third highly-doped P-type region formed in the vicinity of the upper part of the opening, this third region being in contact with an N-type doped polysilicon layer, the three P-type regions being contiguous and forming the base of the transistor.

According to an embodiment of the present invention, the transistor further includes a fourth P-type doped intermediary region between the third and second regions.

According to an embodiment of the present invention, the collector is formed vertically of a portion of the epitaxial layer, of an overdoped region resulting from an implant in the opening and of a buried layer.

The present invention also provides a method for fabricating an NPN transistor in an epitaxial layer of type N, including the steps of defining a window in a thick oxide region; depositing a polysilicon layer and a silicon oxide layer; substantially opening at the center of the window the silicon oxide and polysilicon layers; performing a thermal oxidation; forming in the opening an insulating layer of a first material which is selectively etchable with respect to the silicon oxide; forming spacers in a second material which are selectively etchable with respect to the silicon oxide and to the first material; opening the bottom of the opening within the area defined by the spacers; depositing an N-type doped polysilicon layer; and after the step of opening of the polysilicon and silicon oxide layers, the step of further opening to a determined depth the epitaxial layer and of implanting a P-type doping in the epitaxial layer at the bottom of the opening and on the walls thereof.

According to an embodiment of the present invention, the implant step is a step of oblique implant under low incidence.

According to an embodiment of the present invention, the method further includes a second step of oblique implant under strong incidence and at high dose of a P-type doping.

According to an embodiment of the present invention, the method includes, after the step of formation of an opening in the epitaxial layer, the step of implanting an N-type doping to form in the epitaxial layer an N-type collector region at a higher doping level close to a buried layer of type $N^+$ formed under this epitaxial layer.

According to an embodiment of the present invention, the first material is silicon nitride.

According to an embodiment of the present invention, the second material is polysilicon.

The present invention also aims at a transistor obtained by this method.

These objects, characteristics and advantages as well as others, of the present invention, will be discussed in detail in the following non-limiting description of specific embodiments of the present invention, in relation with the accompanying drawings.

DETAILED DESCRIPTION

Figure 2:
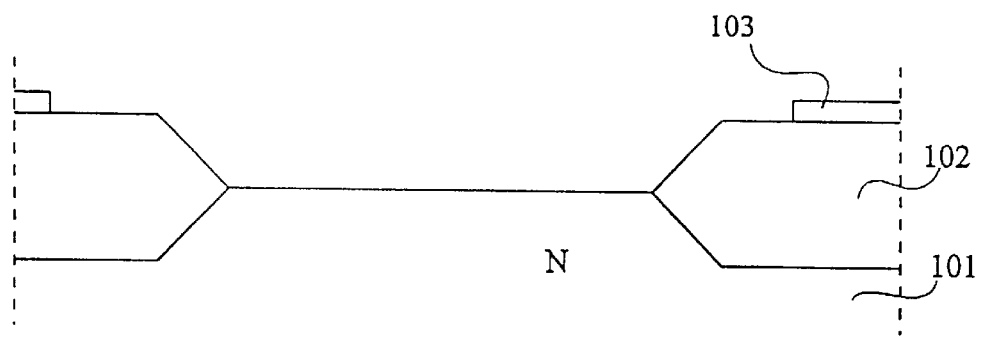
FIGS. 2 to 7 show successive steps of fabrication of a transistor according to the present invention.

FIG. 2 shows an initial step of fabrication of an NPN-type bipolar transistor according to the present invention. On an N-type epitaxial layer 101, a window is defined in a thick oxide layer 102. As an example, a layer 103 open more widely than the window and which may have been used in a previous step of protection of this window during the performing of other steps has also been shown. Layer 103 is for example a silicon oxide layer of a thickness of 20 to 30 nanometers covered with a silicon nitride layer also of a thickness of 20 to 30 nanometers. This layer 103 will not be shown in the following drawings since it has no functional role in the bipolar transistor to be described.

Figure 3:
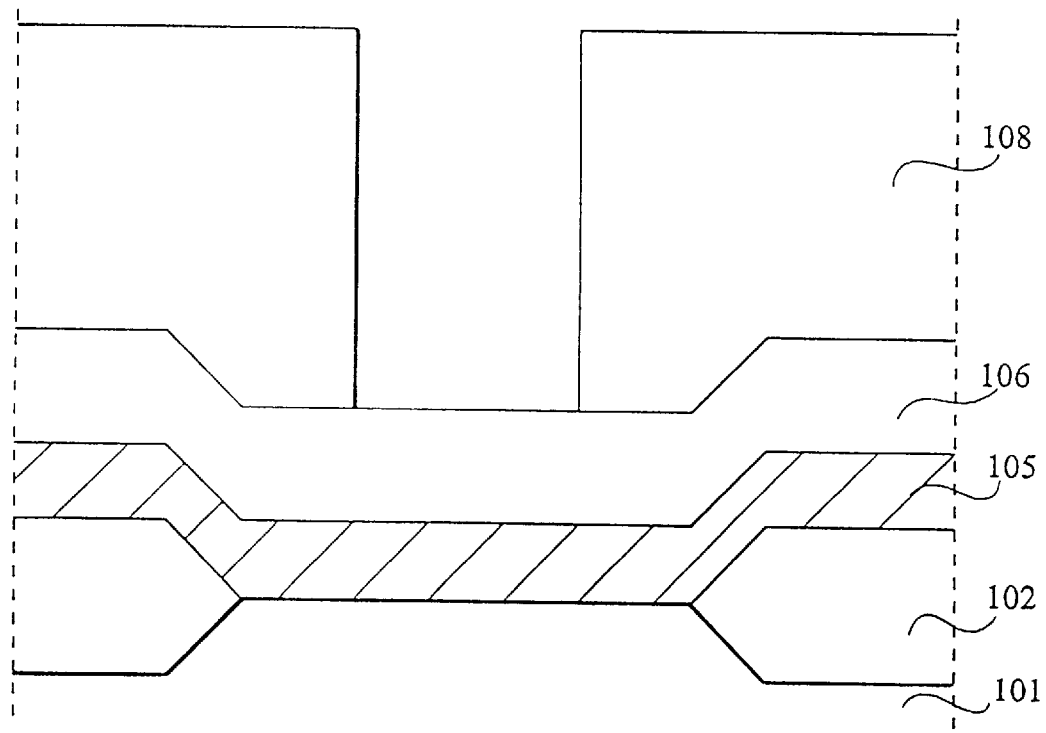

At the step illustrated in FIG. 3, a highly-doped, for example by implant after deposition (typically $BF_2$ at a dose of $5\times10^{15}$ under 20 keV), P-type silicon layer 105, a silicon oxide layer 106, and a masking resist layer 108 are successively deposited.

As an example of numeric values, in an embodiment adapted to the fabrication of submicron dimensioned integrated circuits, the thickness of thick oxide layer 102 can be around 500 nm, the thickness of P-type silicon oxide layer 105 around 200 nm, the thickness of silicon oxide layer 106 around 300 nm, and the thickness of resist layer 108 around 1000 nm (1 $\mu$m).

Then, an opening is made by photolithography in masking layer 108. This opening is disposed substantially centrally in the window formed in thick oxide layer 102. If the window in thick oxide layer 102 has a width of around 1200 nm, the opening in the resist layer has a width of around 400 to 800 nm, for example 600 nm.

Figure 4:
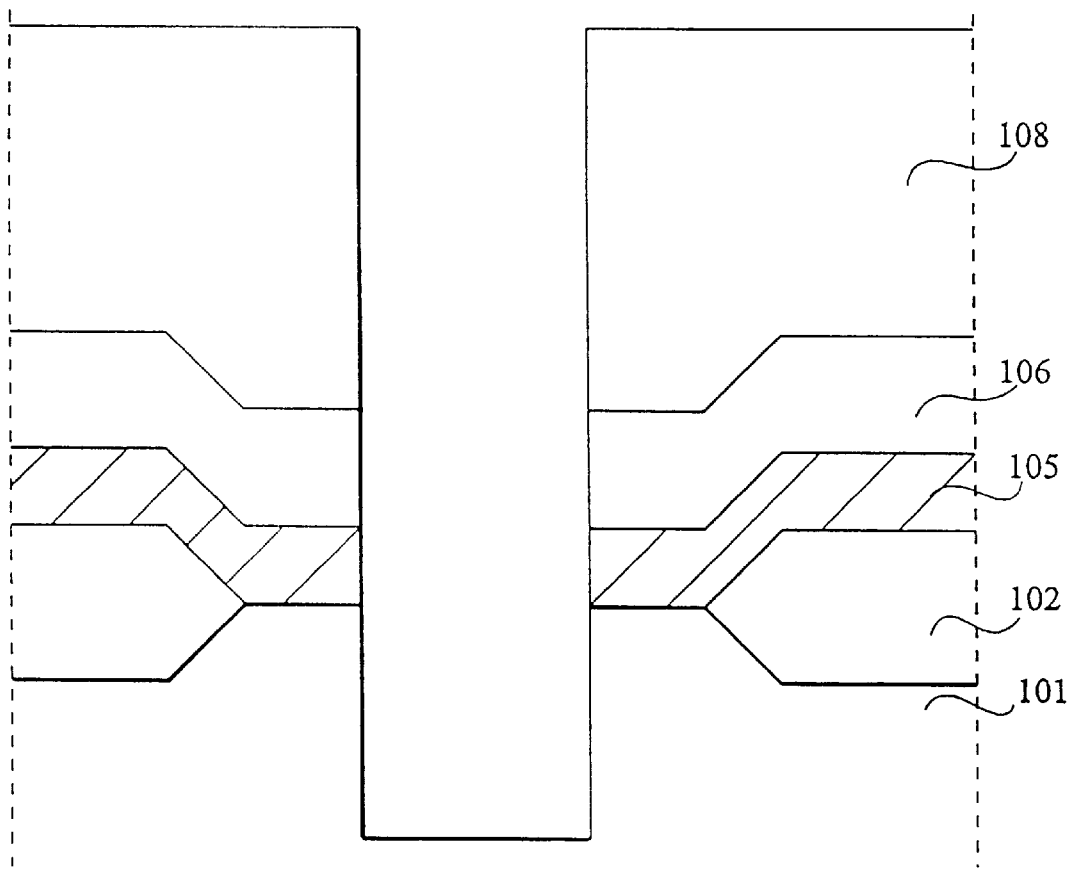

At the step illustrated in FIG. 4, successive anisotropic plasma etchings of silicon oxide layer 106 and polysilicon layer 105 have been performed.

According to an aspect of the present invention, an anisotropic etching of the monosilicon of epitaxial layer 101 is also performed. This etching is continued for a determined duration to reach a selected depth of penetration into the silicon. This depth will for example be around 300 to 1000 nm, for example 600 nm. It should be noted that this depth is far from being negligible and is of the order of magnitude of thick oxide layer 102 (500 nm). As will be seen hereafter, the choice of this depth enables selection of desired characteristics for the NPN transistor.

Figure 5:
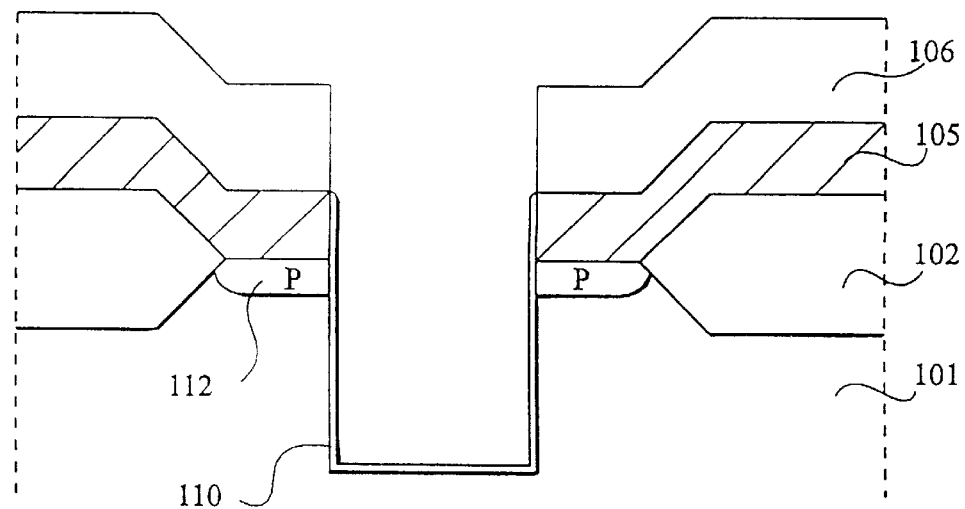

At the step illustrated in FIG. 5, resist layer 108 is removed and an oxidizing annealing is performed to develop a silicon oxide layer 110 within the previously formed opening. This layer develops on the apparent surfaces of monosilicon 101 and polysilicon 105. To reach an oxide thickness of around 5 nm, an annealing in the presence of oxygen at a temperature of 850 to 900° C. can be performed for one quarter of an hour. During this annealing step, the boron or other P-type doping contained in polysilicon 105 diffuses into the underlying silicon to form a base contact region 112, of type P, the junction depth of which is for example around 100 nm.

Figure 6:
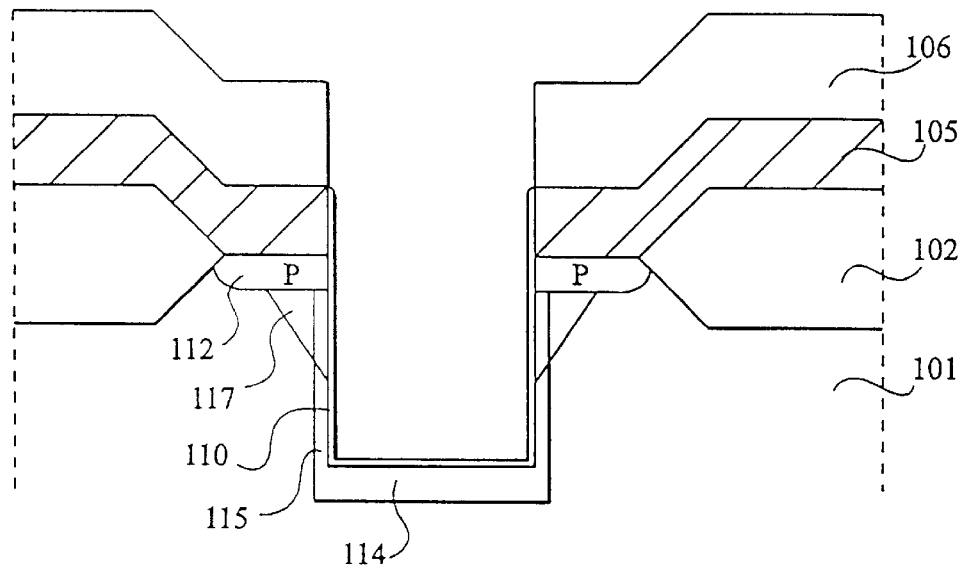

At the following step illustrated in FIG. 6, two successive implants of a P-type doping are performed.

The first implant is performed under oblique incidence at an angle from 1° to 10° as the wafer turns with respect to the axis of implant. A doped area which, after the annealing, has the shape illustrated in the drawing, and includes a deeper implanted area 114 at the bottom of the opening and a shallower implanted area 115 on the sides of the opening is thus obtained. This first implant is for example a boron implant performed under 5 keV with a dose of $2\times10^{13}$ at./cm$^2$.

The second implant is also performed under oblique incidence, as the wafer is rotated, but with a larger angle of incidence than the preceding angle, from 30° to 50°, for example 45°, to implant a doping only in an upper part of the sides of the opening formed in epitaxied layer 101. An implanted region 117, the doping level of which is intermediary between the level of doping of regions 114–115 and that of region 112 is thus obtained. This second implant is for example an implant performed from a boron fluoride ($BF_2$) under high energy (45 keV) and with a relatively high dose, for example $10^{14}$ atoms/cm$^2$.

The implementation of this second implant, although constituting a preferred embodiment of the present invention, is optional.

Figure 7:
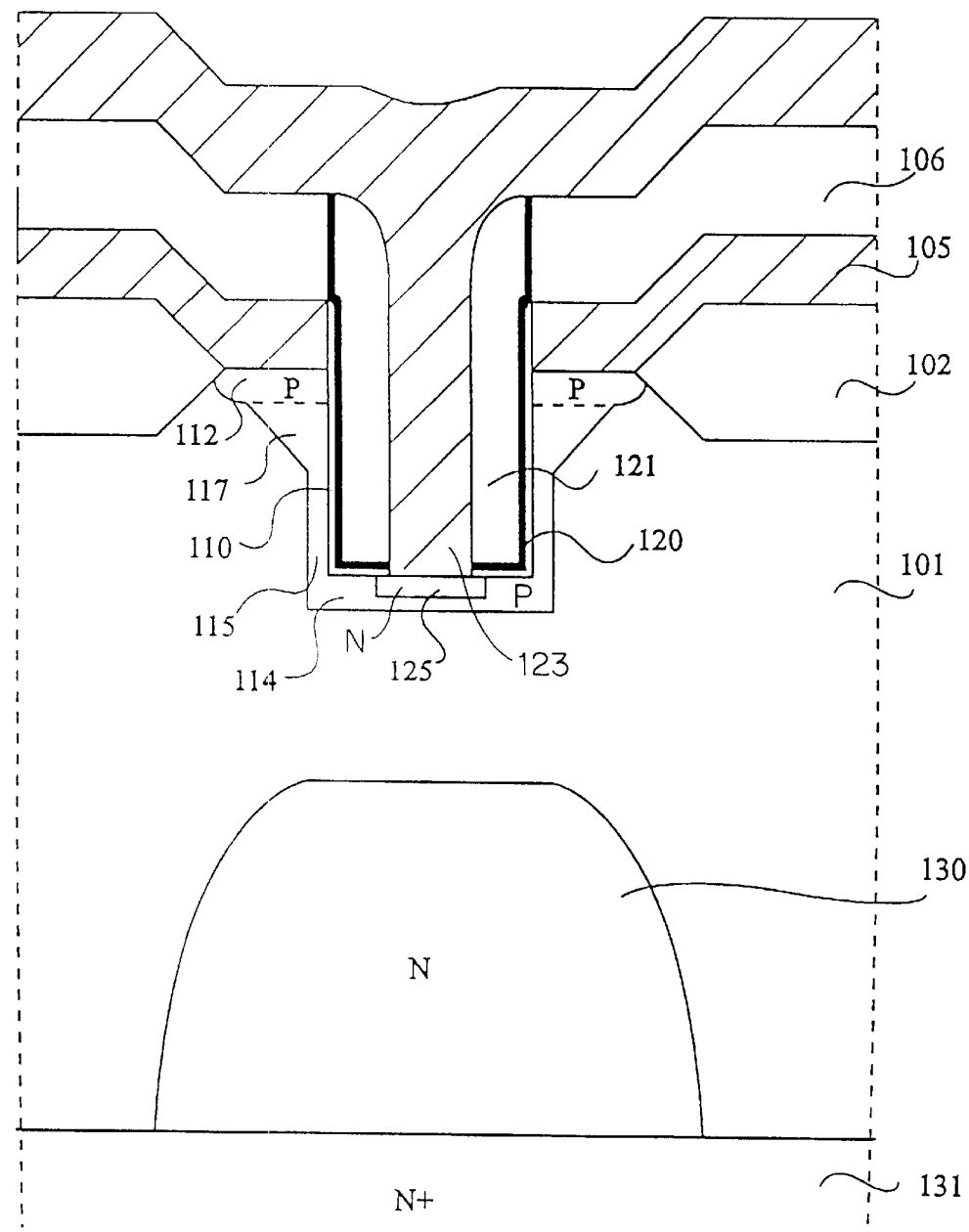

FIG. 7 shows the structure according to the present invention at a practically final step of fabrication. A silicon nitride layer 120 has first been deposited on the entire surface of the device, and especially inside the opening, after which a polysilicon layer 121 has been deposited. The polysilicon layer has been etched, as shown in the drawing, to only leave in place spacers along the walls of the opening. Then, the portions of the silicon nitride layer unprotected by spacers 121 are removed. Afterwards, the apparent portion of thermal silicon oxide layer 110 is removed at the bottom of the opening and an in situ highly-doped N-type polysilicon layer 123 is deposited. A thermal annealing is then performed to diffuse at the bottom of the opening an N-type doped region 125 forming the emitter of the bipolar transistor.

The collector part of the bipolar transistor according to the present invention which has not been shown in FIGS. 2 to 6 is also shown in FIG. 7. This collector part corresponds to a portion of epitaxial layer 101 located under the base-emitter opening and more specifically includes a region 130 formed by implant from the opening immediately after the step illustrated in FIG. 4 (before removal of resist layer 108) and developing above a buried layer of type N$^+$ 131 (itself formed on a silicon wafer of type P, not shown). A collector region 130 effectively localized laterally and in depth under emitter region 125 and intrinsic base region 114 is thus obtained.

Figure 8:
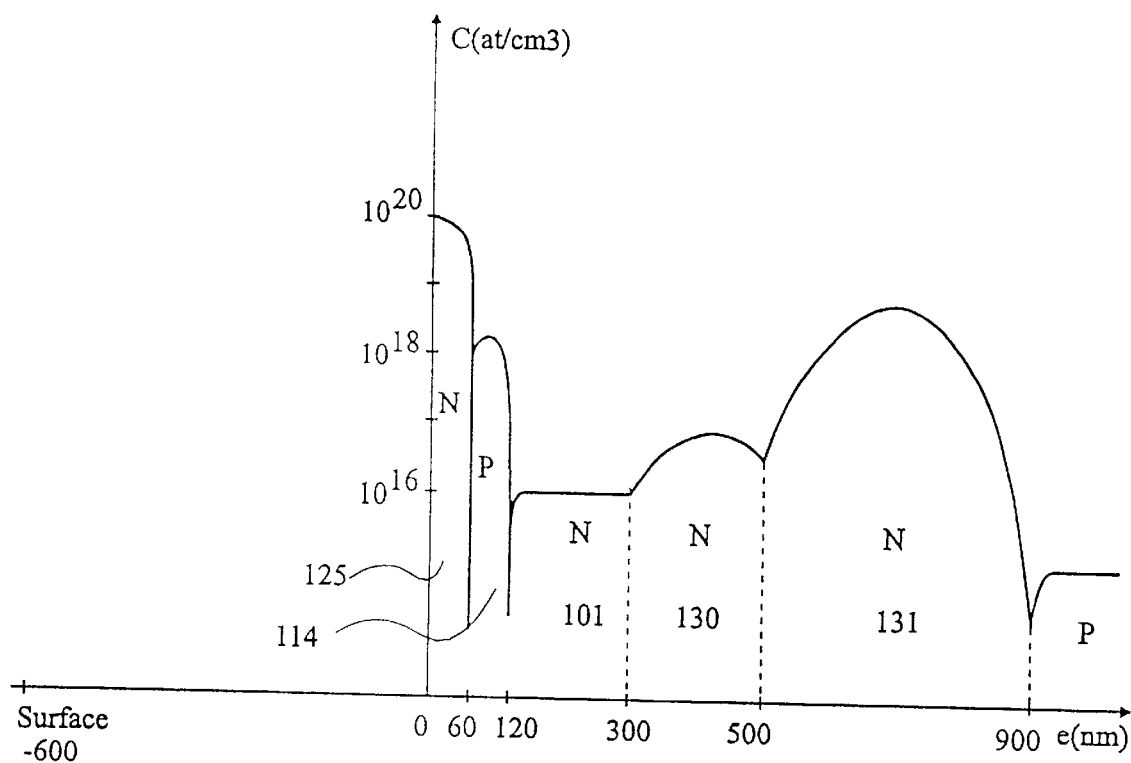
FIG. 8 shows a curve of the doping concentration according to the depth.

FIG. 8 shows an example of doping concentration which can be obtained according to the present invention in a cross-sectional view taken along the axis of the base-emitter opening. There successively appear:

emitter region 125, the surface concentration of which is around $10^{20}$ at./cm$^3$, intrinsic base region 114, the junction concentration of which is around some $10^{18}$ at./cm$^3$, a portion of epitaxial layer 101, the doping level of which is around $10^{16}$ at./cm$^3$, region 130, the maximum doping level of which is around $10^{17}$ at./cm$^3$, buried layer 131, the maximum doping level of which is around $10^{19}$ at./cm$^3$, and the P-type substrate on which the structure is formed, the doping level of which is for example around $10^{15}$ at./cm$^3$.

On the assumption that the thickness of the epitaxial layer is around 1.4 µm (1400 nm) and that the bottom of the opening is at 600 mn from the surface, the thickness of region 125 can be around 60 nm, the total thickness of region 114 under the bottom of the opening can be around 120 mn, the thickness of the epitaxial layer free of overdoping can be around 200 nm, and the thickness of the adapted doping collector region 130 can be around 200 nm.

An essential characteristic of the present invention is to provide an opening of non-negligible depth in epitaxial layer 101 and to provide several levels of base doping around and at the bottom of this opening. Thus, the doping level of intrinsic base region 114 can be set as desired and the resistance of the extrinsic base including regions 115 and 117 towards base contact region 112 can be adjusted as desired to optimize the base resistance, to reduce the base-emitter and base-collector capacitances, and to improve the reverse characteristics of the emitter-base junction. Indeed, these base-emitter and base-collector capacitances essentially depend on the distance between the more doped part 112 and emitter region 114 on the one hand, and the more doped regions of collector 130 on the other hand. The depth of the opening and the base doping levels can be adjusted according to the desired results.

Figure 1:
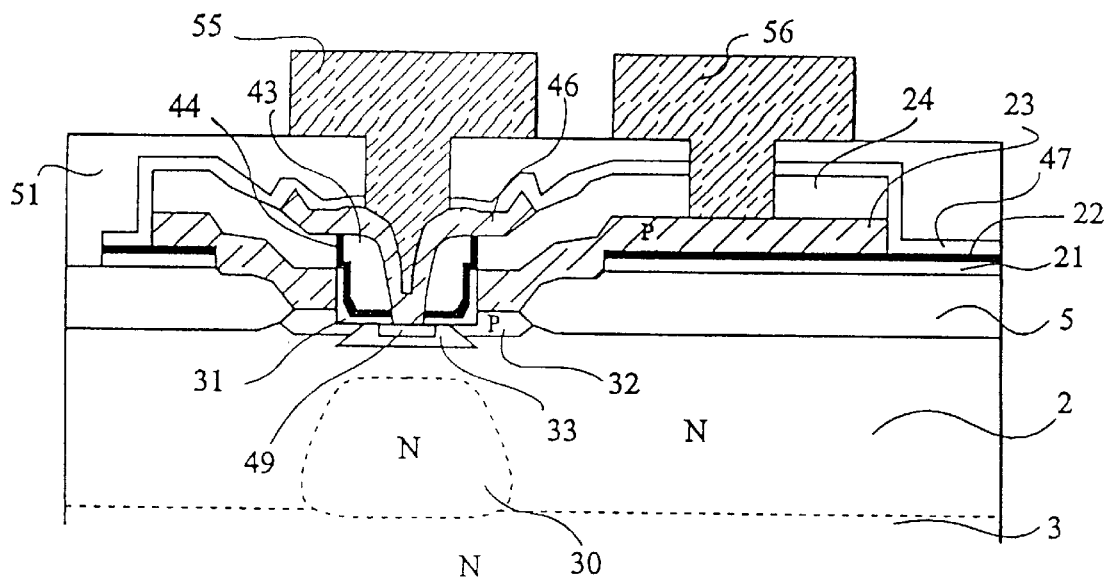
FIG. 1 shows an NPN transistor fabricated by a method described the incorporated by reference patent application referred to above.

Of course, the present invention is likely to have various alterations, modifications, and improvements which will readily occur to those skilled in the art. In particular, the base contact, emitter contact and collector contact recoveries have not been described but can be performed in the way described in relation with FIG. 1.

To avoid any risk of short-circuit between base polysilicon region 105 and emitter polysilicon region 123, the deposition of a silicon nitride layer may be provided at the interface between polysilicon layer 105 and silicon oxide layer 106. The apparent edge, on the side of the opening of this additional silicon nitride layer, will weld with silicon nitride layer 120 upon deposition thereof. Thus, any risk of penetration of etching agent or any etching during a plasma etching at the interface between the edges of silicon oxide layer 106 and the external wall of silicon nitride layer 120 is avoided.

Several numeric values have been indicated as an example, to show that the invention applies to structures of very small dimensions, but the present invention also applies more generally to the implementation of NPN transistors of different dimensions wherein it is desired to optimize the resistances and stray capacitances. Similarly, the use of specific dopings and implant modes has been indicated as an example. Those skilled in the art may use several known variants for the implementation of the dopings.

Several variants of materials can also be performed. For example, other materials may be used for silicon nitride layer 120 and polysilicon layer 121. These two materials only have to be etched selectively with respect to each other and with respect to the silicon oxide, and the second material has to be etchable so as to form spacers.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for fabricating an NPN transistor in an epitaxial layer of type N, including the steps of:

defining a window in a thick oxide region disposed on the epitaxial layer, depositing a polysilicon layer and a silicon oxide layer, forming an opening in the silicon oxide and polysilicon layers at substantially a center of the window, extending the opening into the epitaxial layer, implanting a P-type doping in the epitaxial layer at a bottom of the opening and on walls thereof, performing a thermal oxidation, forming in the opening an insulating layer of a first material which is selectively etchable with respect to the silicon oxide, forming spacers in a second material which are selectively etchable with respect to the silicon oxide and to the first material, opening the bottom of the opening within the area defined by the spacers, and depositing an N-type doped polysilicon layer.

2. The method according to claim 1, wherein the first material is silicon nitride.

3. The method according to claim 1, wherein the second material is polysilicon.

4. The method according to claim 1, wherein the step of implanting a P-type doping comprises several steps of oblique implant and wherein a later step of oblique implanting has an angle of incidence and a dose of P-type doping greater than an earlier step of oblique implanting has.

5. The method of claim 1, wherein the step of extending the opening into the epitaxial layer includes a step of extending the opening into the epitaxial layer to between approximately 300 nm and 1000 nm in depth.

6. The method of claim 1, wherein the step of extending the opening into the epitaxial layer includes a step of extending the opening into the epitaxial layer to a depth that is of a same order of magnitude as the thick oxide region.

7. The method of claim 1, wherein the step of forming the opening includes a step of forming the opening having a width that is approximately one half a width of the window in the thick oxide region.

8. The method according to claim 1, wherein the step of implanting includes an oblique implant under low incidence.

9. The method according to claim 8, further including a second step of oblique implant under strong incidence and at high dose of a P-type doping.

10. The method according to any of claims 1 to 6, including, after the step of extending the opening into the epitaxial layer, a step of implanting an N-type doping to form in the epitaxial layer an N-type collector region at a higher doping level close to a buried layer of type N+ formed under the epitaxial layer.

\* \* \* \* \*